United States Patent [19]

Khalaj et al.

[11] Patent Number: 5,513,275

[45] Date of Patent: Apr. 30, 1996

[54] AUTOMATED DIRECT PATTERNED WAFER INSPECTION

[75] Inventors: Babak H. Khalaj; Hamid K. Aghajan; Thomas Kailath, all of Stanford, Calif.

[73] Assignee: Board of Trustees of the Leland Stanford Junior University, Stanford, Calif.

[21] Appl. No.: 257,236

[22] Filed: Jun. 9, 1994

Related U.S. Application Data

[63] Continuation of Ser. No. 2,864, Jan. 12, 1993, abandoned.

[51] Int. Cl.$^6$ ........................................................... G06K 9/00
[52] U.S. Cl. ........................... 382/149; 382/147; 382/148; 348/126
[58] Field of Search ........................ 382/1, 8, 16, 17, 382/144, 145, 149, 147, 148, 299; 356/237; 348/86, 87, 94, 126

[56] References Cited

U.S. PATENT DOCUMENTS

3,069,654  12/1962  Hough .................................. 340/146.3
4,330,775  5/1982   Iwamoto et al. ......................... 382/141
4,349,880  9/1982   Southgate et al. ....................... 382/145
4,626,907  12/1986  Schedewie ............................... 358/101
4,771,468  9/1988   Batchelder et al. ......................... 382/8
4,845,558  7/1989   Tsai et al. ................................... 382/8
4,898,471  2/1990   Stonestrom et al. .................... 356/237
4,969,198  11/1990  Batchelder et al. ......................... 382/8

*Primary Examiner*—Leo Boudreau
*Assistant Examiner*—David R. Anderson
*Attorney, Agent, or Firm*—Townsend and Townsend and Crew

[57] ABSTRACT

Disclosed is a new self-reference signal processing technique for detecting the location of any nonregularities and defects in a periodic two-dimensional signal or image. Using high-resolution spectral estimation algorithms, the proposed technique first extracts the period and structure of repeated patterns from the image to sub-pixel resolution in both directions, and then produces a defect-free reference image for making comparison with the actual image. Since the technique acquires all its needed information from a single image, on the contrary to the existing methods, there is no need for a database image, a scaling procedure, or any apriori knowledge about the repetition period of the patterns.

4 Claims, 9 Drawing Sheets

AUTOMATED DIRECT PATTERNED WAFER INSPECTION

This invention was made with Government support under contract No. F49620-90-C-0014 awarded by the Department of the Air Force. The Government has certain rights in this invention.

This is a Continuation of application Ser. No. 08/002,864, filed Jan. 12, 1993, now abandoned.

The invention relates generally to image inspection, and more particularly the invention relates to inspection of a two-dimensional periodic image for irregularities and defects.

BACKGROUND OF THE INVENTION

The background of the invention is described with reference to the prior art references identified in Appendix A, attached hereto. The task of detection and localization of defects in VLSI wafers and masks is an essential but exhausting procedure. As the complexity of integrated circuits is increasing rapidly, the need to automate the inspection of photomasks and wafers becomes a more important necessity for maintaining high throughput and yield in the fabrication processes. Human visual inspection and electrical testing are the most widely used methods for defect detection; however, this is a time consuming and difficult task for people to do reliably. On the other hand the usage of electrical test is inherently limited to off-line and overall functional verification of the chip structure, and can only be accomplished after the fabrication is completed; it cannot be applied to on-line and layer by layer inspection of the wafer during the fabrication process. In addition to the need for inspecting wafers, the inspection of the mask pattern is critical because any defect on the mask is transferred to the wafers.

Typical patterns found in wafers and masks can be put into three main classes [1]:

Constant areas

Straight lines

Repeating structures

The repeating structure class covers two different cases. The first includes repeated patterns within a single chip such as memory areas, shift registers, adders, and switch capacitors. The chips themselves considered as repeated patterns on a wafer can be included in the second case. As another potential example of repeating patterns, one can mention LCD displays and arrays of charge-coupled devices (CCDs) arising in imaging systems and cameras.

Most inspection techniques fall into one of the following general categories: methods for checking generic properties and design rules, and methods based on image-to-image comparison. In the first category, the image is tested against a set of design rules or local properties and violations are reported as defects. An example of this kind of techniques is the work of Ejiri et al [2] that uses an expansion-contraction method to locate the defects. In image to image comparison methods, the image taken from the wafer is compared either with an ideal image stored in a database, or with the image taken from another region of the same wafer that is supposedly identical to the image under the test. A fairly complete review of the related literature may be found in [3].

Several optical inspection techniques have been developed for locating and classifying defects on masks and wafers. In spatial filtering methods [4, 5, 6], the spectrum of the perfect image in the Fourier transform domain is filtered out from the image and an image that includes only defective patterns is obtained. Since it is difficult to filter out only the frequencies of the acceptable pattern, these systems usually require large signal to noise ratios [7]. Also it is usually required to precisely align the filter and the sample. In addition, for each pattern, a separate filter has to be prepared [8].

Most commercial inspection systems compare the chip patterns with a pre-stored image in a database. This requires a large volume of data as a reference. A data conversion step is also needed to make the scaling of the stored data equal to that of the inspected image [7]. As the size of devices decrease, proper adjustment of the scales for doing the required comparisons becomes more difficult to achieve. As an alternative to this approach that avoids the need for a large database, images of two adjacent dies can be compared; however, the detection is limited by step-and-repeat errors and also the errors in synchronizing the location of the two scanner beams over the die.

As was mentioned earlier, an important category of defect inspection applications is the inspection of repeated patterns on masks and wafers. This is a field of application for image-to-image comparison methods in which the repeatedness of the patterns is used. However, most existing systems that perform image to image comparison face the following difficulties. In order to compare images with each other, or with a reference database, accurate registration is necessary. This includes both problems of alignment and scaling and introduces a tradeoff between the minimum detectable defect size and the expense and throughput of the systems that compare the image with another image or a database image. Moreover, if an image to database comparison method is chosen, there is also the need to simulate the imaging and development processes in order to produce the database.

A self-reference technique that avoids the mentioned difficulties was developed by Dom et al [9], in which the comparison is made using the repeated cells in the image. In this method prior knowledge about the period of repetition is assumed and scaling of the image is adjusted accordingly; then each pixel is compared with two corresponding pixels in left and right neighboring patterns.

SUMMARY OF THE INVENTION

In accordance with the present invention a method is provided for extracting the structure of repeated patterns, or the building block, from the acquired image itself; and then detecting the defects by comparing the resulting building block with the image. Extracting the repeated structure from the image eliminates the need for producing a database and avoids the scaling problem as well. There is also no need for the image to exactly contain a certain number of pattern blocks. Also rather than using only pixels from neighboring patterns, the proposed method exploits information contained in the whole image to decide whether a pixel corresponds to a defect or not. Moreover, the techniques used in the proposed approach yield sub-pixel resolution for estimating the size of the building block.

The method includes three basic steps. In the first step the repetition periods of the patterns in both the horizontal and vertical directions are estimated separately by a sub-pixel method. After obtaining good estimates of these periods, the building block of the image is extracted by a proper sub-pixel weighted sum of the repeated patterns throughout the image. In the final step the location of defects is determined by subtracting shifted versions of the building block from the image. In order to reduce the number of false alarms especially at the edges of the image, some ideas from fuzzy-logic and median filtering are used in this step. By passing the resulting difference image through a proper threshold, the location of the defects is obtained.

The invention and objects thereof will be more readily understood from the following detailed description and appended claims when taken with the drawings.

DETAILED DESCRIPTION OF ILLUSTRATIVE EMBODIMENTS

3.1 Estimating the Period of Repeatedness

In the first step we are looking for estimates of the periods of a periodic image in the horizontal and vertical directions. There are a number of different methods for estimating the period of a two-dimensional signal; such as 2D FFT, 2D autocorrelation, etc., however the major drawback of using these two-dimensional methods is their computational cost. In order to reduce the amount of computations, we note that the estimation of the horizontal and vertical periods of a periodic image are separable problems in nature and by transforming the problem into two one-dimensional problems, large savings in computational cost can be achieved. One way of doing this transformation is described below:

Let the image be denoted by the matrix F. We only treat here the estimation of the horizontal period of the image: an identical procedure is used for estimating the vertical period. The rows of F are 1×N vectors and are named $f_i$, i=1, ..., N, so that we can write $$F = \begin{bmatrix} \leftarrow f_1 \rightarrow \\ \cdot \\ \cdot \\ \leftarrow f_N \rightarrow \end{bmatrix} \quad (1)$$

The simple horizontal projection of the image produces an N×1 vector $x_N$ whose elements are $$x_i = \sum_{j=1}^{N} (f_i)_j, \; i=1, \ldots, N \quad (2)$$

Then, the goal is to estimate the fundamental frequency of the signal $x_N$.

The general problem of extracting the spectral components of a signal arises in a wide range of application areas such as in communications systems, geophysical data processing, and vibration analysis. The objective in time series analysis is to obtain estimates of the sinusoidal frequencies in a discrete time signal presumed to be composed of a superposition of sinusoids added with noise. In a more generic case, one can consider general exponential sinusoids with decaying or growing envelopes. Mathematically, if the N×1 vector $x_N$ denotes the observed time series, and $\Lambda = [\lambda_1, \ldots \lambda_d]$ is the unknown vector of exponential terms, the observed signal can be expressed as $$x_k = \sum_{i=1}^{d} s_i \lambda_i^{k-1} + n_k \quad (3)$$

where $s_i$ contains the amplitude and phase of the $i^{th}$ exponential $\lambda_i = e^{jw_i}$, and n is the additive noise term.

As a matter of background, there are a number of different ways for estimating the period of a periodic signal. Among these methods one can mention the classical methods based on FFT and autocorrelation, the maximum entropy method [10], the maximum likelihood method [11], and also the new high-resolution subspace based methods such as MUSIC [12], and ESPRIT [13, 14].

The major drawback of the classic methods is their limited resolution, which depends on the width of the signal. In cases where the image contains a large number of periods of the repeating structure, simple methods such as FFT might give acceptable estimates and are usually quite faster than the higher resolution methods. But in some typical images of wafers, the number of periods of the pattern can be as low as 5 and since the resolution of the FFT method for a given signal frequency is proportional to the number of observed periods of the signal, the period that is estimated by this method is not acceptable in these situations. Also it should be noted that in general, the period of the patterns is not an integer number of the pixels of the image, and it is necessary to use a sub-pixel algorithm for period estimation.

In this claim we will concentrate on high-resolution subspace-based spectral estimation methods, which are widely used in sensor array processing problems. In matrix formulation, the entire signal can be written as $$x_N = \begin{bmatrix} 1 & \ldots & 1 \\ \lambda_1 & \ldots & \lambda_d \\ \cdot & & \cdot \\ \cdot & & \cdot \\ \cdot & & \cdot \\ \lambda_1^{N-1} & \ldots & \lambda_d^{N-1} \end{bmatrix} \begin{bmatrix} s_1 \\ \cdot \\ \cdot \\ \cdot \\ s_d \end{bmatrix} + \begin{bmatrix} n_1 \\ \cdot \\ \cdot \\ \cdot \\ n_N \end{bmatrix} \quad (4)$$

To apply subspace methods, we need to compute the sample covariance matrix of the measurements. The above formulation views the data as one snapshot of a uniform linear array. This defines only a one-dimensional signal subspace. To obtain a subspace of dimension d, we divide $x_N$ into P vectors of length m by sliding a window of size m over the data. The value of m should satisfy $d < m \leq N-d+1$. Then, P plays the role of the number of snapshots here as compared with array processing formulation. Thus, the data is rearranged as follows $$X_m = \begin{bmatrix} x_1 & x_2 & \ldots & x_{N-m+1} \\ x_2 & x_3 & \ldots & x_{N-m+2} \\ \cdot & \cdot & & \cdot \\ \cdot & \cdot & & \cdot \\ \cdot & \cdot & & \cdot \\ x_m & x_{m+1} & \ldots & x_N \end{bmatrix} \quad (5)$$

$$= A_m(\Lambda)[s \; \Phi s \; \ldots \; \Phi^{N-m} s] +$$

$$\begin{bmatrix} n_1 & n_2 & \ldots & n_{N-m+1} \\ n_2 & n_3 & \ldots & n_{N-m+2} \\ \cdot & \cdot & & \cdot \\ \cdot & \cdot & & \cdot \\ \cdot & \cdot & & \cdot \\ n_m & n_{m+1} & \ldots & n_N \end{bmatrix} \quad (6)$$

where $$A_m(\Lambda) = \begin{bmatrix} 1 & \ldots & 1 \\ \lambda_1 & \ldots & \lambda_d \\ \cdot & & \cdot \\ \cdot & & \cdot \\ \cdot & & \cdot \\ \lambda_1^{m-1} & \ldots & \lambda_d^{m-1} \end{bmatrix} \quad (7)$$

and $\Phi = \mathrm{diag}[\lambda_1 \ldots \lambda_d]$. The vector s contains the amplitudes of different frequency components and is not important in our analysis.

With the above formulation, the signal subspace techniques of sensor array processing can be applied to estimate the significant frequencies of the signal $x_N$. A computationally efficient technique for estimating the frequency components in the above problem is the ESPRIT algorithm [13, 14]. ESPRIT assumes the availability of measurements from two identical subarrays that are displaced from each other by a displacement vector $\Delta$. In the time series analysis, the measurements come from equally spaced time instants. So this problem possesses the structure required by ESPRIT and the frequencies of the sinusoids in the time series signal can be estimated by this method.

In our application, the signal $x_N$ is a periodic signal and has a set of harmonically related frequency components. In other words, we only need to estimate the frequency of the first harmonic of the signal. If the signal obtained by projection has a large component in its principle frequency (which is true for square waveforms), then by choosing the number of components equal to 4 (corresponding to the first and second harmonics in positive and negative frequencies). one can directly obtain the period of the signal using a subspace method. However, in general, there may be a relatively large amount of energy in higher harmonics, and in these cases one can estimate the value of these higher harmonics of the signal and since the frequencies of these harmonics should be multiples of the principle frequency, this frequency can be extracted by a simple linear least-squares method.

3.2 Extracting the Building Block

Given the estimated periods of row and column projections, the building block is constructed by simply shifting a window of proper size through the image and adding the corresponding pixel values together. Since in general the size of the building block is not an integer number of pixels, it is necessary to shift the window by subpixel values and use interpolation to find the values of these points. Although different interpolation methods can be used for this purpose, in our examples a simple linear interpolation proved to be sufficient and was used for this purpose.

If the estimated horizontal and vertical periods of the image are $T_x$ and $T_y$ respectively, the size of the building block BB(k,l) will be $$1 \leq k \leq \mathrm{int}(T_x)+1$$

$$1 \leq l \leq \mathrm{int}(T_y)+1$$

Denoting the value of the N×N image at location (k,l) by F(k,l), the following equations are used to construct the building block $$\begin{aligned} BB(k, l) = & \sum_{i=1}^{n_1} \sum_{j=1}^{n_2} (1-r_i)(1-s_j) F(k_i+k, l_j+l) + \\ & r_i(1-s_j) F(k_i+k+1, l_j+l) + \\ & (1-r_i) s_j F(k_i+k, l_j+l+1) + \\ & r_i s_j F(k_i+k+1, l_j+l+1) \end{aligned} \quad (8)$$

where $n_1 = \mathrm{int}(N/T_x)$ $n_2 = \mathrm{int}(N/T_y)$ $k_i = \mathrm{int}(T_x * i)$ $l_j = \mathrm{int}(T_y * j)$ $r_i = T_x * i - k_i$ $s_j = T_y * j - l_j$ By averaging among all of the blocks in image, the amount of noise and the effect of the defects are reduced considerably and a good estimate of building block is obtained in this way. It should also be mentioned that if the sizes of defects in an image are so large that the computed building block is no longer a good estimate of the true value, then although the defect can not be localized exactly, the algorithm will still give an alarm and will reject the sample.

3.3 Detecting the Defects

Once the building block is constructed, one can simply compare each point of the original image with the corresponding point in the building block, and if the difference is larger than a threshold, that point may be identified as a defect. However, because of the quantization effects at the edges of the image, in practice each point should also be compared with the eight neighboring points of its corresponding point in the building block. Having computed the difference between each point of the image and all 9 points in the neighborhood of its corresponding point in the building block, that point of the image is assigned a value equal to the minimum of the absolute value of these differences. It is this value that gives a measure of the probability that the point is a defect.

Mathematically, the above procedure can be stated by the relation $$\min_{-1 \leq i,j \leq 1} |F(m, n) - BB(k + i, l + j)| \quad (9)$$

where $$k = m - \text{int}(m/T_x) * T_x$$

$$l = n - \text{int}(n/T_y) * T_y$$

It should be noted that depending on a specific application, one may use other filtering methods to reduce the amount of quantization noise.

By transforming all the points of the image to such a difference image, and using a proper threshold value, one can classify the points of image as either defects or nondefects. The value of the threshold generally depends on the contrast of the image and the amount of the difference in intensity which is supposed to be interpreted as a defect and can be chosen accordingly.

4 Summary of the Algorithm

In this section, an outline of the defect detection algorithm is presented.

Project the image along horizontal and vertical directions. This step yields two measurement vectors that are used to estimate the periods of the image.

In this stage, any spectral estimation method can be applied to estimate the cisoidal components of each of the two vectors. However, in order to obtain high resolution and closed-form estimates, use subspace-based techniques of array processing as follows.

Rearrange each measurement vector using Eq. (5) such that P snapshot vectors of size M are produced.

Apply any subspace-based method of sensor array processing (e.g. the ESPRIT algorithm) to estimate principle frequency of each of the two measurement vectors. This yields sub-pixel estimates of the image periods in both directions.

Using Eq. (8), construct the building block of the image.

Compare each point of the image with the corresponding neighborhood in the building block. Using Eq. (9), assign a difference value to the point. If the difference is larger than a threshold, identify the point as a defect.

5 Experimental Results

In this section we apply the developed techniques to the detection of defects in images that have repeated pattern blocks.

In these examples, real images taken by an optical microscope are considered. In this case the periods in neither of the two directions are exact numbers of pixels and the sub-pixel algorithm is necessary to obtain a good estimate of these non-integer numbers.

Figure 1:
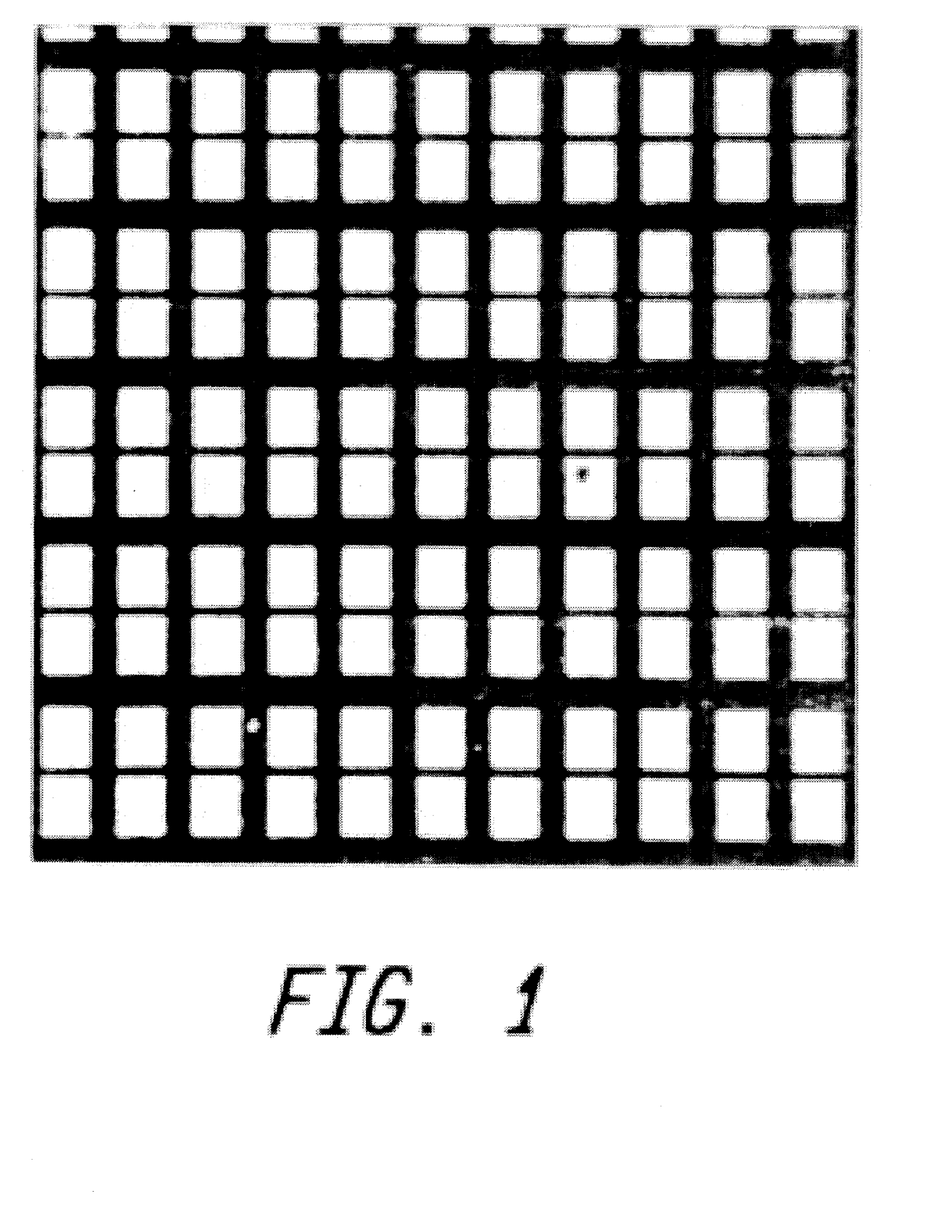
FIG. 1 is an image from a repeated pattern chip.
Figure 2:
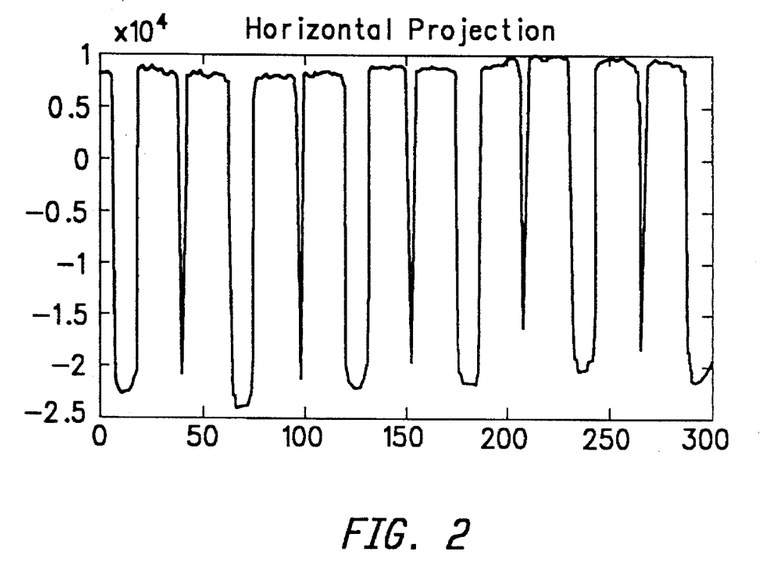
FIG. 2 is a projection vector along the horizontal axis of the image in FIG. 1.
Figure 3:
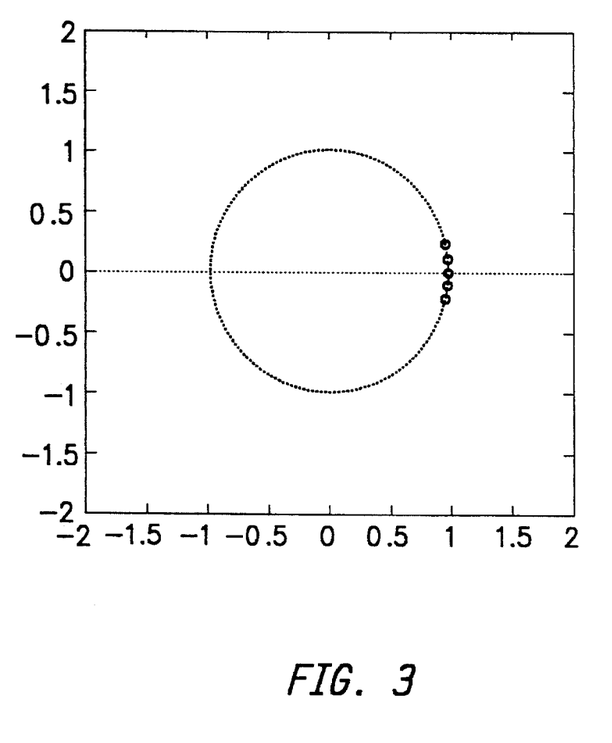
FIG. 3 illustrates horizontal spatial frequencies of the image in FIG. 1 estimated by the ESPRIT algorithm.
Figure 4:
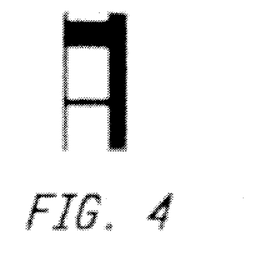
FIG. 4 is the building block of the image in FIG. 1.
Figure 5:
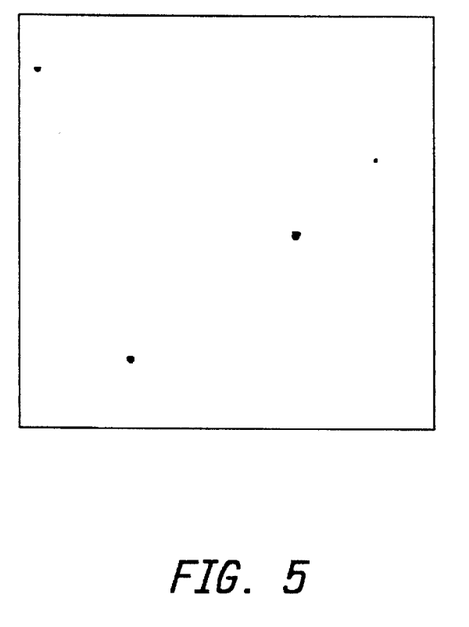
FIG. 5 illustrates defects of the image in FIG. 1 extracted by the proposed technique.

In FIGS. 1 and 2 the image and its projection along the horizontal axis are shown. In fact the signal in FIG. 2 is the signal whose period is to be estimated. The spatial frequencies of this signal as estimated by the ESPRIT algorithm are shown in FIG. 3. Finally the estimated building block of this image and the location of the defects are shown in FIGS. 4 and 5 respectively.

Figure 6:
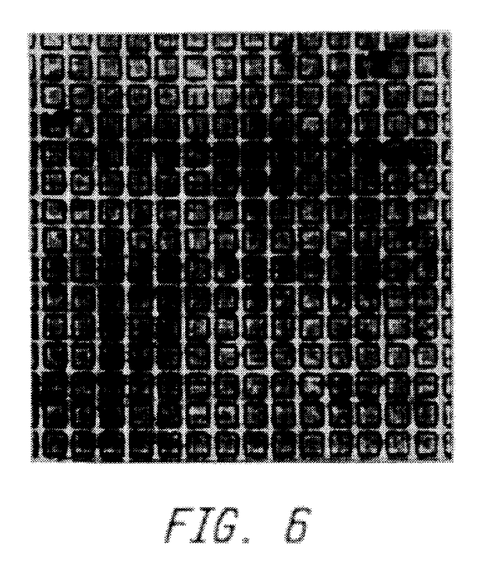
FIG. 6 illustrates another image from a repeated pattern chip.
Figure 7:
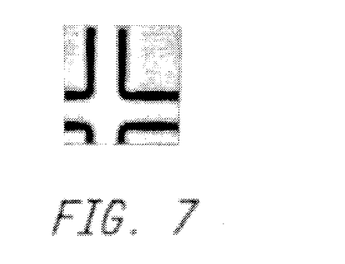
FIG. 7 illustrates the building block of the image in FIG. 6.
Figure 8:
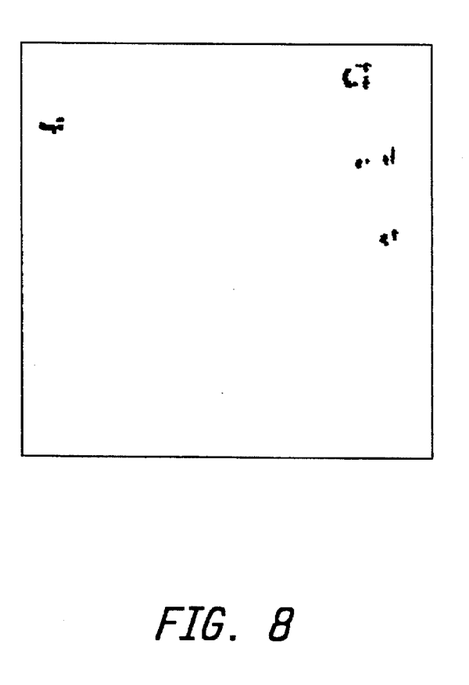
FIG. 8 illustrates defects of the image in FIG. 6 extracted by the proposed technique.

FIG. 6 shows the image of another patterned wafer, and FIGS. 7 and 8 show the extracted building block and the location of the defects in this example.

Figure 9:
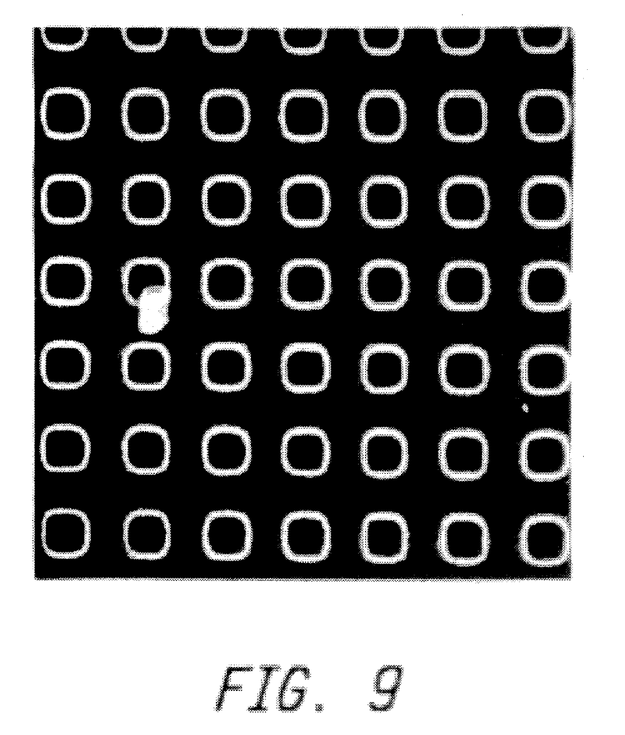
FIG. 9 illustrates another image from a repeated pattern chip.
Figure 10:
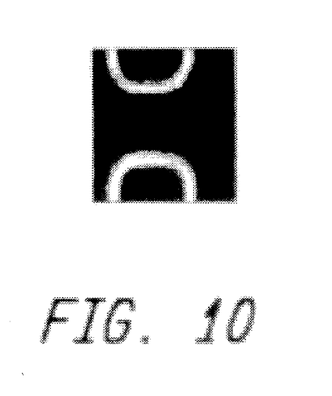
FIG. 10 illustrates the building block of the image in FIG. 9.
Figure 11:
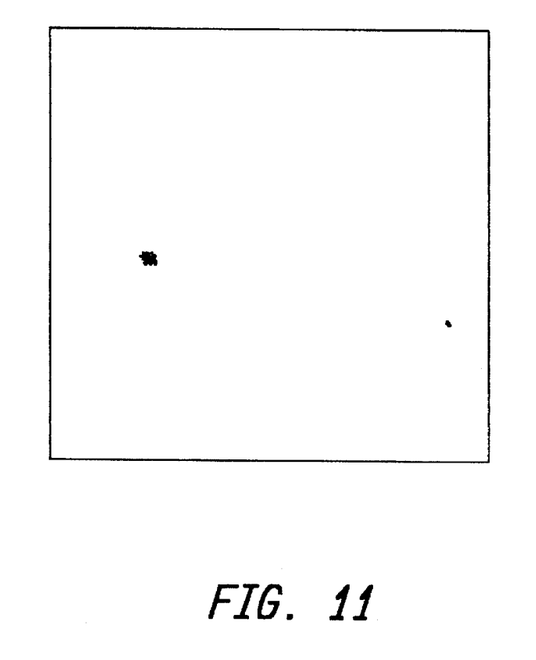
FIG. 11 illustrates defects of the image in FIG. 9 extracted by the proposed technique.

FIG. 9 shows an image of a set of contact holes on a wafer. In FIGS. 10 and 11, the building block of the original image and the detected defects are shown, respectively.

FIG. 9 shows an image of a set of contact holes on a wafer. In FIGS. 10 and 11, the building block of the original image and the detected defects are shown, respectively.

Figure 12:
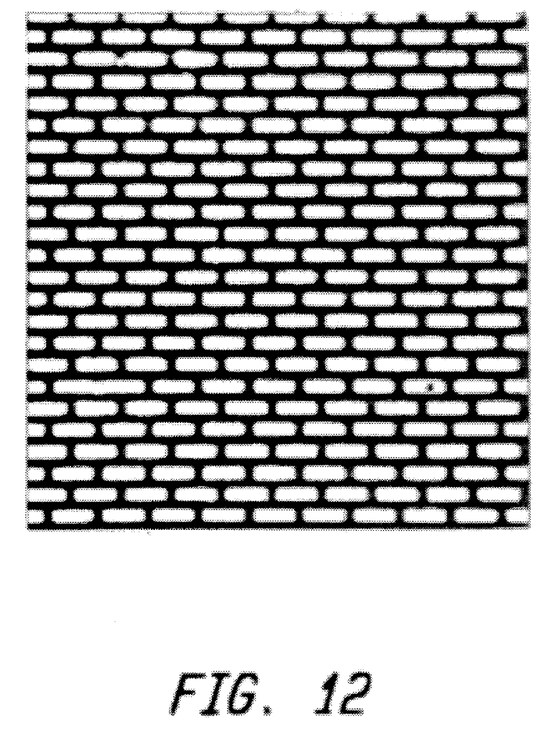
FIG. 12 illustrates an image from a chip with similar and shifted rows.
Figure 13A:
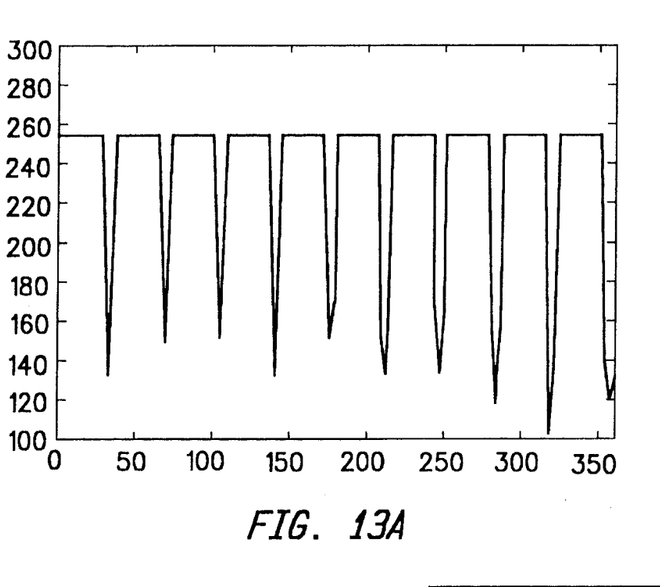
FIGS. 13(a) & (b) illustrate plots of two rows of the image of FIG. 12 that are similar but shifted versions of each other.
Figure 13B:
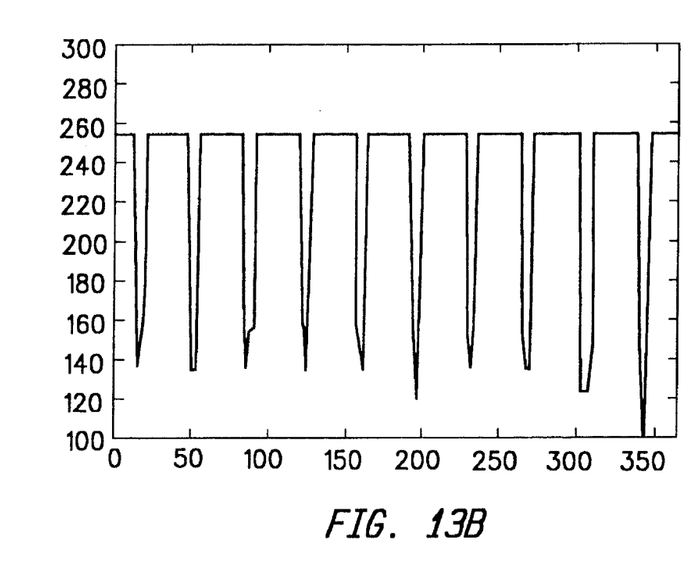
Figure 14:
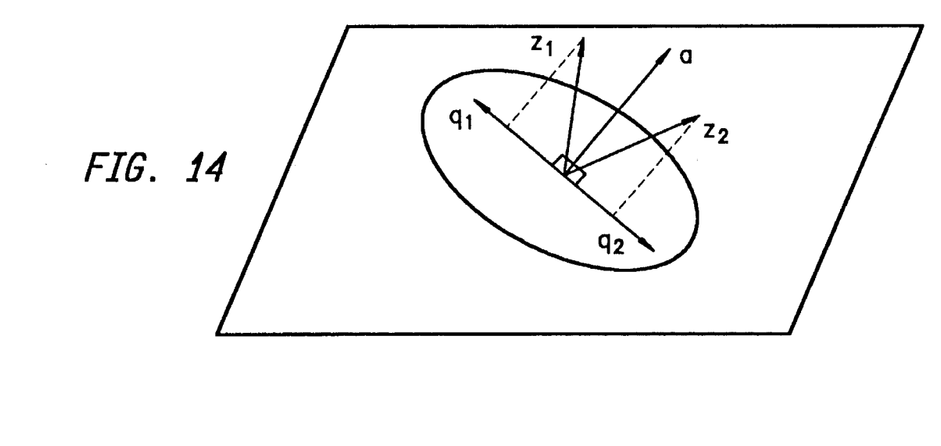
FIG. 14 illustrates a diagram showing how two similar and shifted rows of the image are mapped to vectors with opposite directions.
Figure 15A:
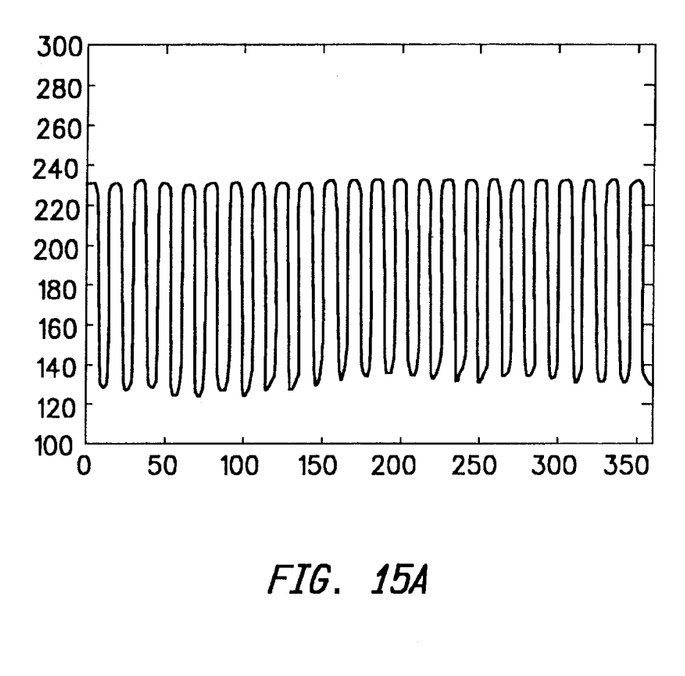
FIG. 15a illustrates the result of simple projection of the image of FIG. 12 along horizontal axis.
Figure 15B:
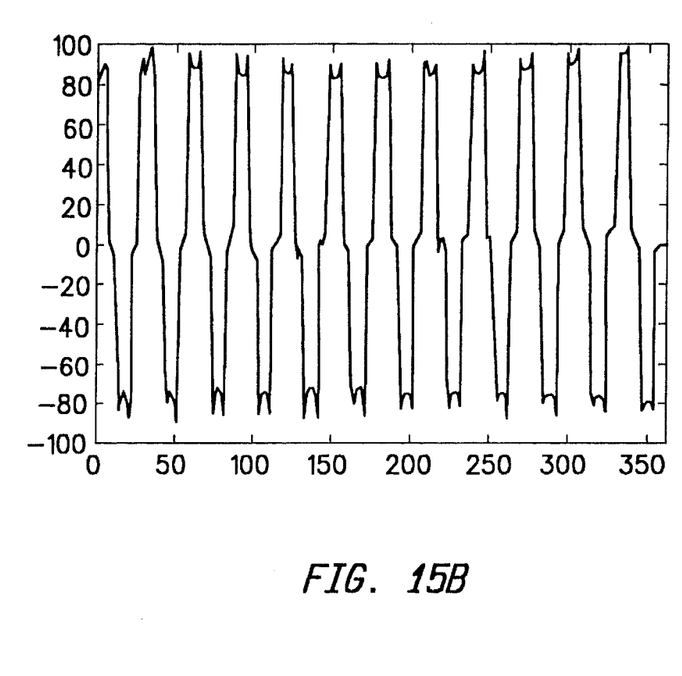
FIG. 15b illustrates the result of applying the projection after preprocessing the image (see text).
Figure 16:
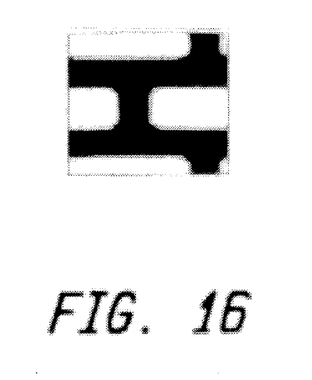
FIG. 16 illustrates the building block of the image in FIG. 12.
Figure 17:
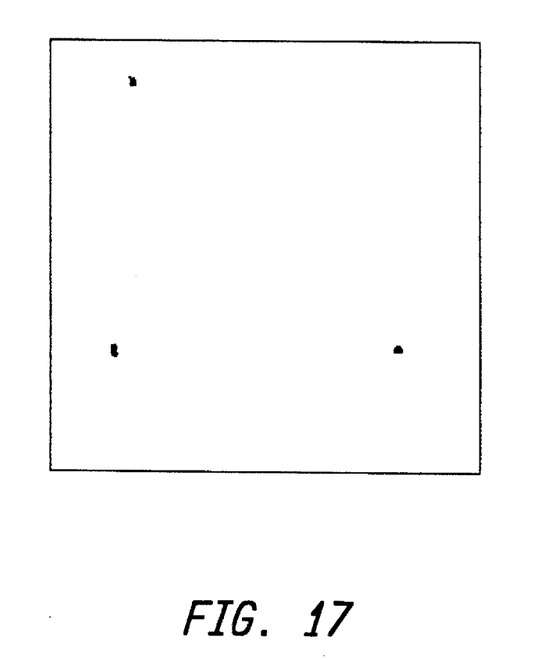
FIG. 17 illustrates defects of the image in FIG. 12 extracted by the proposed technique.

The forth example considers another real image, which consists of two interlaced subimages that are shifted with respect to each other (FIG. 12). As a result, there are some rows of the image that are similar but shifted versions of each other (FIGS. 13a, 13b), and by simple projection of the image along the horizontal axis we obtain a signal that has almost twice the true frequency of the patterns. In such cases by a proper preprocessing of the image (see below), we obtain another signal that has the correct pattern frequency (FIG. 15). By estimating the period of this signal, the building block and the location of defects are obtained accordingly (FIGS. 16 and 17). To handle these cases a simple preprocessing step can be applied to the image as follows. First each row is centered by removing its mean. Let the new rows be denoted by $z_i$, i=1, ..., N. The average vector of all rows is calculated and called a. Then each row of the image is projected onto the plane orthogonal to a. By this transformation the two vectors that were shifted versions of each other will be transformed to vectors 180 degrees apart. In FIG. 14, a simple diagram is shown to visualize this situation. Vectors $z_1$ and $z_2$ represent the two similar and shifted rows and their projections onto the space orthogonal to a are along directions $q_1$ and $q_2$, respectively. After this preprocessing step, the inner product of each of the two kinds of rows with a selected row vector will have opposite signs to each other. An example of such cases is presented in FIG. 12. In FIGS. 13(a) and (b), the two similar and shifted rows of the image are shown. Simple projection of these rows results in similar values in the projection vector x which is shown in FIG. 15(a). However, by implementing the preprocessing step and multiplying the transformed image by one of these typical vectors, the two shifted vectors will be transformed to two opposite numbers and so the period of the projection will be equal to the true period of the patterns. In the above example, the resulting projection vector x has the form shown in FIG. 15(b) in which the effects of similar rows have been converted to opposite values.

While the invention has been described with reference to specific embodiments, the description is illustrative of the invention and is not to be construed as limiting the invention. Various modifications and applications will occur to those skilled in the art without departing from the true spirit and scope of the invention as defined by the appended claims.

APPENDIX A

[1] F. Babian, *Optical Defect Detection Limits in Semiconductor Wafers and Masks*, PhD thesis, Stanford University, Stanford, Calif. 94305, 1986.

[2] M. Ejiri, T. Uno, M. Mese, and S. Ikeda, "A Process for Detecting Defects in Complicated Patterns", *Computer Graphics and Image Processing*, 2:326–339, 1973.

[3] A. E. Kayaalp and R. Jain, "A Knowledge Based Automatic On-Line Wafer (IC) Inspection System", In *Proc. of VISION 85*, pages 117–130, 1985.

[4] L. H. Lin, D. L. Cavan, R. B. Howe, and R. E. Graves, "A Holographic Photomask Defect Inspection System", In *Proc. of SPIE, Optical Microlithography IV*, pages 110–116, 1985.

[5] R. Browning, I. Lincoln, and P. Stonestorm, "Recent Advances in Automated Patterned Wafer Inspection", In *Proc. of SPIE, Integrated Circuit Metrology, Inspection, and Process Control III*, pages 440–445, 1989.

[6] Y. Miyazaki, H. Tanaka, N. Kosaka, and T. Tomada, "Surface Defect Inspection System with an Optical Spatial Frequency Filter for Semiconductor Patterned Wafers", In *Proc. of SPIE, Integrated Circuit Metrology, Inspection, and Process Control VI*, pages 515–525, 1992.

[7] S. Chae, *Defect Detection and Classification in VLSI Pattern Inspection*, PhD thesis. Stanford University, Stanford, Calif. 94305, 1987.

[8] H. Tanaka, Y. Miyazaki, N. Mikami. N. Nosaka. and T. Tomada, "Inspection of Patterned Wafer Surface using Eletro-Optic Spatial Light Modulator", In *Proc. Optical Computing*, pages 144–147, 1988.

[9] B. E. Dom, V. H. Brecher, R.. Bonner, J. S. Batchelder, and R. S. Jaffe, "The P300: A System for Automatic Patterned Wafer Inspection", *Machine Vision and Applications*, 1(3):205–221, 1988.

[10] J. P. Burg, *Maximum Entropy Spectral Analysis*, PhD thesis, Stanford University, Stanford, Calif. 94305, 1975.

[11] J. Capon, Maximum-likelihood spectral estimation, In S. Haykin, editor, *Non-linear Methods of Spectral Analysis*, chapter 5. Springer-Verlag, New York, 2nd edition, 1983.

[12] R. O. Schmidt, *A Signal Subspace Approach to Multiple Emitter Location and Spectral Estimation*, PhD thesis, Stanford University, Stanford, Calif. 94305, 1981.

[13] A. Paulraj, R. Roy, and T. Kailath, "Estimation of Signal Parameters by Rotational Invariance Techniques (ESPRIT)", In *Proc. of 19th Asilomar Conference on Circuits, Systems and Comp.*, 1985.

[14] R. Roy and T. Kailath, "ESPRIT: Estimation of Signal Parameters via Rotational Invariance Techniques", *IEEE Trans. on ASSP*, 37(7):984–995, July 1989.

What is claimed is:

1. A method of inspecting a two dimensional periodic image of a semiconductor device and a photomask as used in semiconductor device fabrication for irregularities and defects comprising the steps of a) estimating repetition periods of patterns in horizontal and vertical directions in said image, b) extracting a building block of said image based on said repetition periods including obtaining a sub-pixel weighted sum of repeated patterns throughout said image, and c) subtracting shifted versions of said building block from said image to locate defects and irregularities.

2. The method as described in claim 1 wherein step a) includes providing a one dimensional projection of each row and each column and estimating a fundamental frequency in each one dimensional projection.

3. The method as described in claim 1 wherein step c) includes subtracting each point of said image with eight neighboring points of the corresponding point in said building block, and assigning each point the minimum absolute value of the eight differences.

4. A method of inspecting a two dimensional periodic image of a semiconductor device and a photomask as used in semiconductor device fabrication for irregularities and defects comprising the steps of a) estimating repetition periods of patterns in horizontal and vertical directions in said image, b) extracting a building block of said image based on said repetition periods including obtaining a sub-pixel weighted sum of repeated patterns throughout said image, and c) locating defects and irregularities in said image based on said building block.

* * * * *